(12) United States Patent
Chen et al.

(10) Patent No.: US 6,497,981 B2
(45) Date of Patent: Dec. 24, 2002

(54) METHOD OF FORMING COLOR FILTER ARRAY

(75) Inventors: Jain-Hon Chen, Chiayi (TW); Jeenh-Bang Yeh, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 135 days.

(21) Appl. No.: 09/801,257

(22) Filed: Mar. 7, 2001

(65) Prior Publication Data
US 2002/0127481 A1 Sep. 12, 2002

(51) Int. Cl.[7] .............................. G02B 5/20; H01L 27/14
(52) U.S. Cl. ......................................................... 430/7
(58) Field of Search ................................ 430/7; 257/432, 257/440

(56) References Cited

U.S. PATENT DOCUMENTS 5,143,855 A * 9/1992 Pace et al. .................. 437/3

FOREIGN PATENT DOCUMENTS

| JP | 59-228757 A | * 12/1984 |
| JP | 10-332920 A | * 12/1998 |

* cited by examiner

*Primary Examiner*—John A. McPherson
(74) *Attorney, Agent, or Firm*—J.C. Patents

(57) ABSTRACT

A method of forming a color filter array. A substrate having a passivation layer thereon is provided. A negative color photoresist layer is formed over the passivation layer. A photolithographic exposure process is conducted using a light source with a wavelength less than or equal to 248 nm so that a pattern for forming a color filter array is imprinted on the negative color photoresist layer.

20 Claims, 4 Drawing Sheets

METHOD OF FORMING COLOR FILTER ARRAY

BACKGROUND OF THE INVENTION

1. Field of Invention

The present invention relates to a method of forming an optical device. More particularly, the present invention relates to a method of forming a color filter array (CFA).

2. Description of Related Art

Color filter array (CFA) is frequently used in optical devices for displaying color images. In such an optical device, each pixel generally corresponds to three neighboring but different color filters. In other words, a specified color is permitted to pass through each filter. A complete color palette can be obtained, for example, by mixing the colors from the three filters such as red (R), green (G) and blue (B). Therefore, the pixel array in an image display device actually consists of an array of three types of color filters such as an array of red filters, an array of green filters and an array of blue filters.

The fabrication of an optical device that displays colorful images normally involves forming a passivation layer such as a silicon oxynitride (SiON) layer over an array of background light sensitive devices. Thereafter, the three color filter arrays are independently fabricated over the passivation layer.

FIGS. 1A through 1C are schematic cross-sectional views showing the progression of steps for fabricating a conventional tricolor filter array. First, as shown in FIG. 1A, a substrate 100 having an array of metallic layers 110 thereon, in which the metallic layers 100 serve as light-sensitive elements, is provided. A passivation layer 120 such as a silicon oxynitride layer is formed over the substrate 100 and the metallic layers 110. A red negative photoresist layer 130 is formed over the passivation layer 120. An i-line light source (365 nm) 132 shines on the photomask 134 and exposes a portion of the red photoresist layer 130. Ultimately, cross-linking of high molecular weight polymer occurs in a light-exposed region 136 of the red photoresist layer.

As shown in FIG. 1B, a chemical development of the red photoresist layer is carried out so that red photoresist material outside the exposed region 136 is removed. Thus, a red color filter 140 is produced.

As shown in FIG. 1C, the steps illustrated in FIG. 1B are repeated twice to form a green color filter 150 and a blue color filter 160, respectively. Note that only one red/green/blue color filter (140/150/160) is shown in the figure. In fact, an array of red/green/blue color filters covering a wide area is formed.

However, the conventional method of fabricating a color filter array has several problems. First, an I-line light source 132 having a wavelength of 365 nm is used to carry out exposure. However, the silicon oxynitride layer is a poor absorber for light of this wavelength and hence cannot absorb reflected light 132a coming from a lower layer. Consequently, a portion of red photoresist 130 outside the desired exposure region 136 is also exposed leading to the formation of cross-linked polymers. After a post-exposure development, a residual patch 130a of red photoresist remains over the passivation layer 120. In the presence of a residual patch 130a, subsequent fabrication of the green filter 150 and the blue filter 160 are also affected. Ultimately, image quality of the device will deteriorate.

Second, the conventional method of forming a blue color filter array often leads to color pixel peeling due to insufficient light exposure. FIGS. 2A and 2B are schematic cross-sectional views showing a conventional technique for forming a blue color filter array on a substrate and resulting adverse consequence. As shown in FIG. 2A, an i-line light source 232 shines through a photomask 234 and exposes a portion of the blue negative photoresist layer 230 on the passivation layer 220. Since blue negative photoresist has a relatively high i-line absorption coefficient, lower edges of the exposed region 236 in the photoresist layer 230 may not receive sufficient i-line light to trigger cross-linking. Consequently, as shown in FIG. 2B, the blue color filter 240 is narrower at its base than at its top after photoresist development. Hence, the chance of this blue color filter 240 peeling off increases considerably (the dashed lines indicate the position of the blue filter before peeling).

In addition, resolution of a light source with a wavelength of 365 nm is relatively low and hence area utilization is unsatisfactory. Furthermore, resolution of the color filters is ultimately limited by the resolution of the light source.

SUMMARY OF THE INVENTION

Accordingly, one object of the present invention is to provide a method of forming a color filter array. A substrate having a passivation layer such as a silicon oxynitride layer thereon is provided. A negative color photoresist layer is formed over the passivation layer. A photolithographic exposure process is conducted using a light source with a wavelength less than or equal to 248 nm so that a pattern for forming the color filter array is imprinted on the negative color photoresist layer.

In the aforementioned photolithographic exposure, a light source having a wavelength less than or equal to 248 nm is used in photolithographic exposure. Since silicon oxynitride material has a higher light absorption capacity for light at such a wavelength, the passivation layer actually serves also as an anti-reflection coating that improves the final quality of the patterned color filter array.

In addition, by using a light source having a wavelength less than or equal to 248 nm rather than an i-line light source, resolution of the photolithographic process is increased. Ultimately, both area utilization and resolution of the color filter panel improves.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
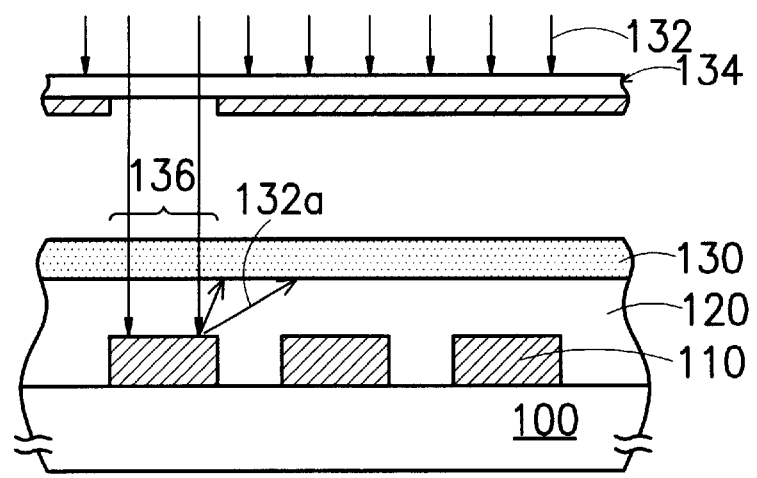
FIGS. 1A through 1C are schematic cross-sectional views showing the progression of steps for fabricating a conventional tricolor filter array.
Figure 1B:
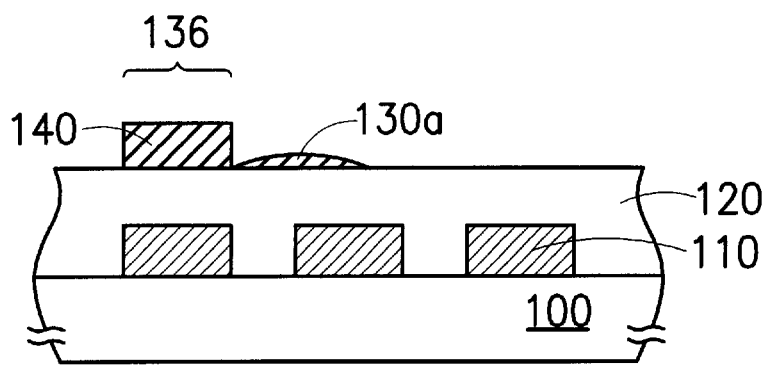
Figure 1C:
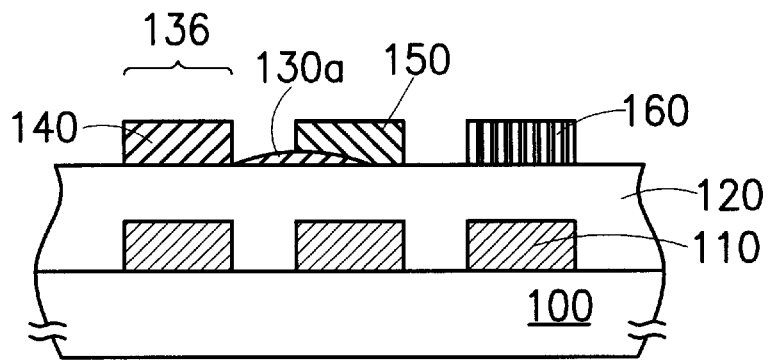
Figure 2A:
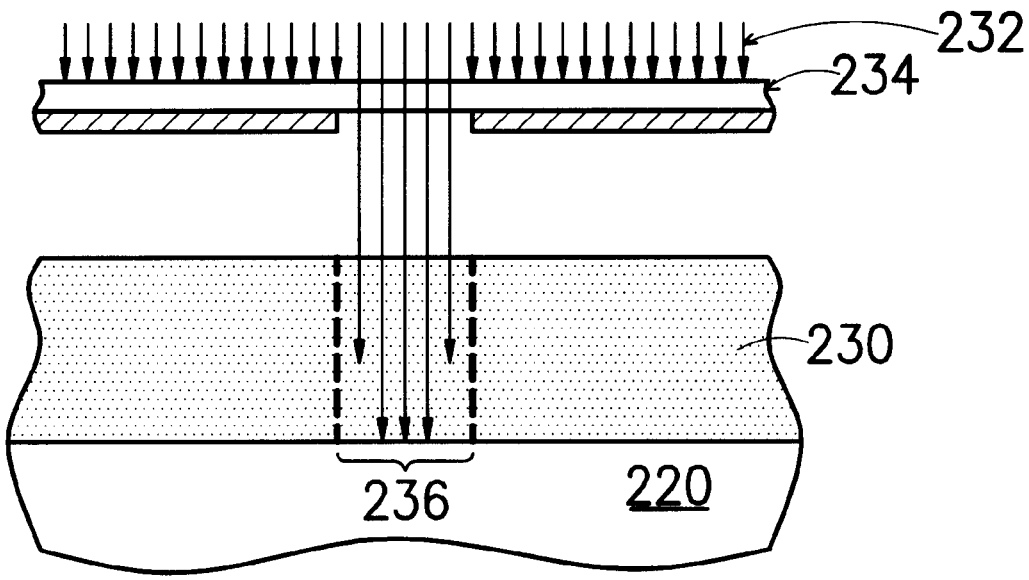
FIGS. 2A and 2B are schematic cross-sectional views showing a conventional technique for forming a blue color filter array on a substrate and resulting adverse consequence.
Figure 2B:
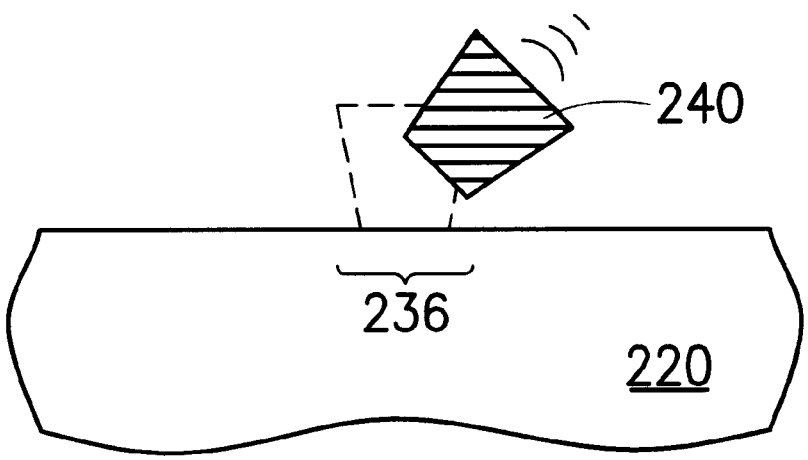

Reference will now be made in detail to the present preferred embodiments of the invention, examples of which are illustrated in the accompanying drawings. Wherever possible, the same reference numbers are used in the drawings and the description to refer to the same or like parts.

Figure 3A:
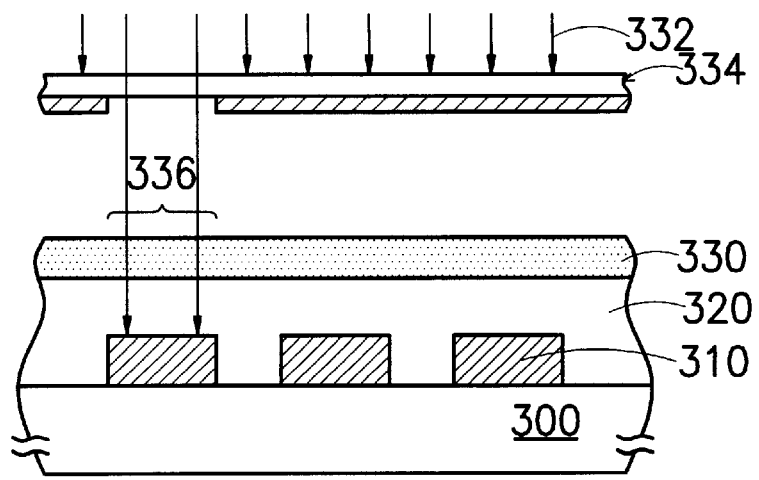
FIGS. 3A through 3C are schematic cross-sectional views showing the progression of steps for fabricating a tricolor filter array according to a preferred embodiment of this invention.
Figure 3B:
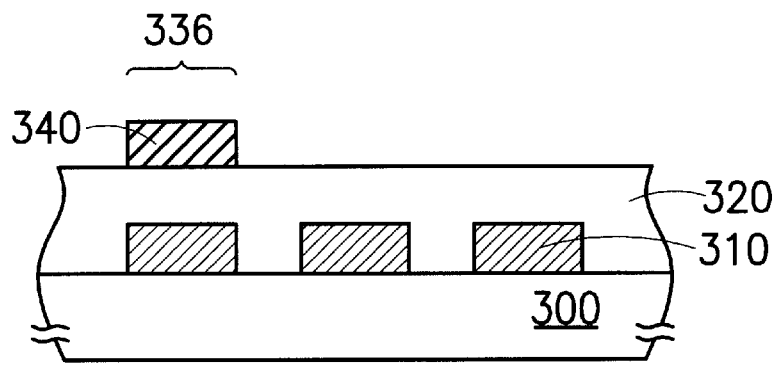
Figure 3C:
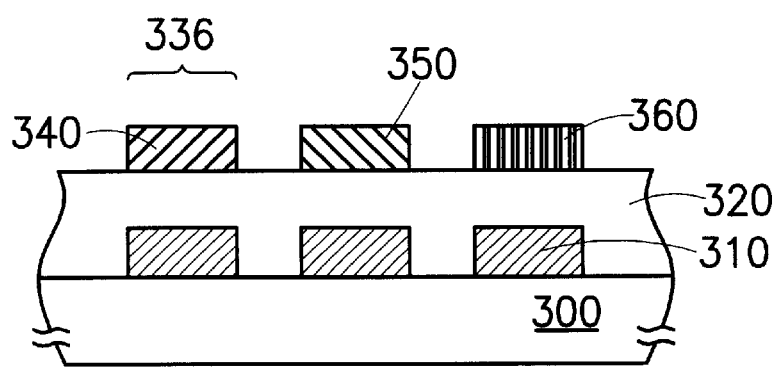

FIGS. 3A through 3C are schematic cross-sectional views showing the progression of steps for fabricating a tricolor filter array according to a preferred embodiment of this invention.

As shown in FIG. 3A, a substrate 300 having an array of metallic elements 310 thereon is provided. The array of metallic elements 310 serves light sensors so that a current is produced and delivered to a detector when a light impinges upon the metallic elements 310. A passivation layer 320 is formed over the substrate 300 and the metallic elements 310. The passivation layer 320 can be a silicon oxynitride layer having a thickness greater than 1000 Å. A negative color photoresist layer 330 that permits only a first color light to pass through is formed over the passivation layer 320 by, for example, spin-coating. The first color light can be red light or green light, for example. A photolithographic exposure of the color negative photoresist layer 330 is carried out. Shining a beam of light with a wavelength of 248 nm through a mask 334 over the photoresist layer 330 results in a cross-linking of polymers in an exposed region 336 of the color photoresist layer 330. Since the passivation layer 320 is made from silicon oxynitride and silicon oxynitride is an effective medium for absorbing light with a wavelength of 248 nm, diff-usion of light from any layer below the negative color photoresist layer 330 is prevented. Ultimately, very little residual photoresist material is formed outside the light-exposed region 336 after photoresist development.

As shown in FIG. 3B, a photoresist development is carried out to remove photoresist material from the color photoresist layer 330 outside the exposed region 336 and form a color filter 340.

As shown in FIG. 3C, the steps illustrated in FIGS. 3A and 3B are repeated twice. In other words, photolithographic process is conducted twice to form color filters 350 and 360 on the passivation layer 320. The color filter 350 permits a second color light and the color filter 360 permits a third color light to pass through. The first color, the second color and the third color combine to produce a complete color level. The three colors are red light, green light and blue light, for example. Because no residual photoresist is formed outside the light exposed region 336, the color filters 350 and 360 can be formed without any complications. Note that only one color filter for each color is shown in the FIGS. 3B and 3C. In fact, each of the color filters 340, 350 and 360 represents an array of identical color filters that cover a wide area.

Figure 4A:
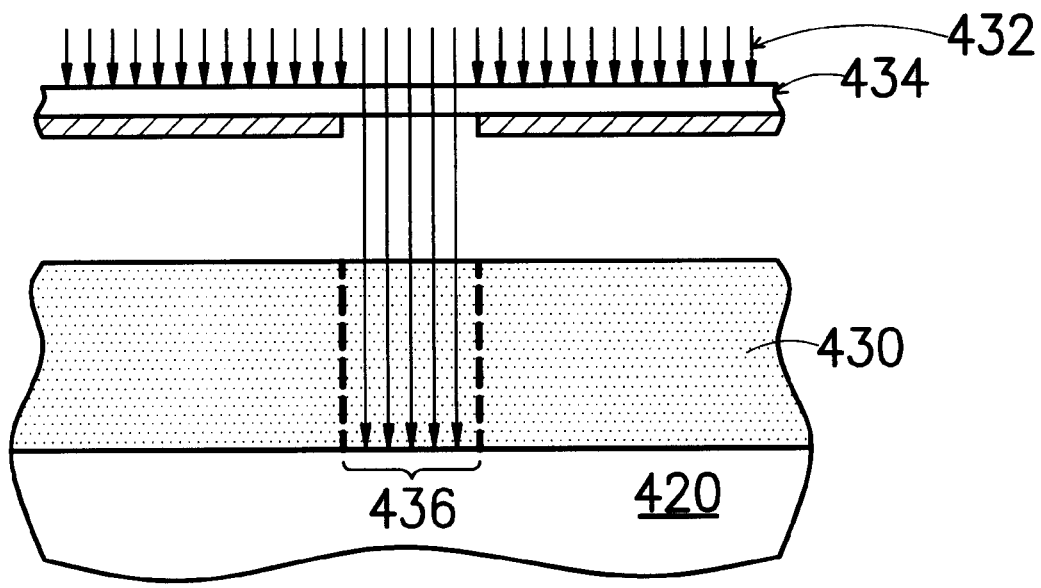
FIGS. 4A and 4B are schematic cross-sectional views showing the technique for forming a blue color filter array on a substrate according to this invention and resulting positive consequence.
Figure 4B:
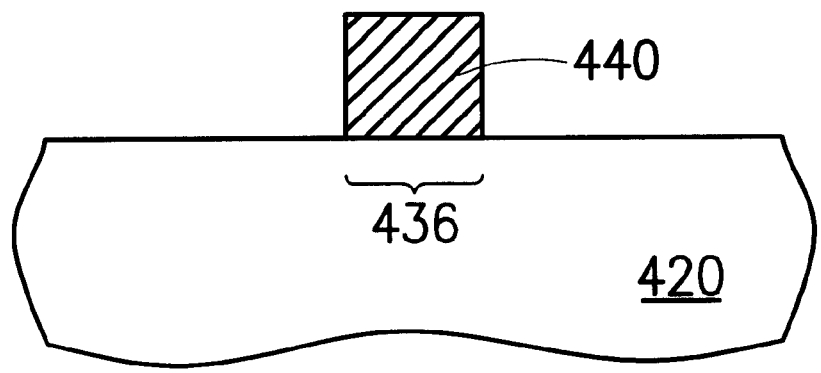

FIGS. 4A and 4B are schematic cross-sectional views showing the technique for forming a blue color filter array on a substrate according to this invention and resulting positive consequence.

As shown in FIG. 4A, a light source 432 shines through a photomask 434 and exposes a portion of the blue negative photoresist layer 430 on the passivation layer 420. Since blue negative photoresist has a relatively low absorption coefficient for 248 nm light compared with 365 nm i-line light, the entire exposed region 436 is able to receive sufficient 248 nm wavelength light from the light source 432 to trigger cross-linking. Consequently, as shown in FIG. 4B, the blue color filter 440 has a uniform section after photoresist development. Hence, the probability of photoresist peeling decreases tremendously.

In this invention, the silicon oxynitride passivation layer 320 is an effective absorber of 248 nm light. Hence, the passivation layer 320 serves also as an anti-reflection coating (ARC) preventing the production of residual photoresist on exposed region after photoresist development. Therefore, filtering capacity and image reception capacity of the color filter array are improved. Moreover, negative blue photoresist 430 absorbs only a little of the 248 nm light leading to the prevention of peeling problems in the fabrication of blue filter array.

In addition, resolution follows the formula for resolution $R=k_1 \cdot \lambda/NA$ (where R is the smallest distance that can be resolved, and NA is the numerical aperture of an optical system). Hence, using a smaller wavelength light source to carry out photoresist exposure may result in a higher photolithographic resolution. Ultimately, both area utilization and color filter panel resolution are increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a color filter array, comprising:
   providing a substrate;
   forming a passivation layer over the substrate;
   forming a color photoresist layer over the passivation layer, wherein the color photoresist layer only permits a first color to pass through; and
   performing a photolithographic exposure of the color photoresist layer using light of a wavelength smaller than or equal to about 248 nm so that a pattern for forming a color filter array is imprinted on the color photoresist layer.

2. The method of claim 1, wherein the color photoresist layer includes a negative color photoresist layer.

3. The method of claim 1, wherein the passivation layer also serves as an antireflection coating for absorbing light from the light source during photolithographic exposure.

4. The method of claim 3, wherein the passivation layer further includes a silicon oxynitride layer.

5. The method of claim 4, wherein the silicon oxynitride layer has a thickness greater than about 1000 Å.

6. The method of claim 1, wherein the light used in photolithographic exposure has a wavelength of about 248 nm.

7. The method of claim 1, wherein the substrate further includes a light sensitive element array thereon.

8. The method of claim 7, wherein the light sensitive element array includes a plurality of metallic elements for generating a detectable electrical current when light impinges upon the elements.

9. The method of claim 1, wherein the first color light is a red light, a green light or a blue light.

10. The method of claim 1, wherein after forming the color filter array, further includes:

forming a first different color photoresist layer over the passivation layer, wherein the first different color photoresist layer only permits a second color light to pass through;

performing a second photolithographic exposure using light from a light source so that a pattern for forming a first different filter array is imprinted in the first different color photoresist layer;

forming a second different color photoresist layer over the passivation layer, wherein the second different color photoresist layer only permits a third color light to pass through; and performing a third photolithographic exposure using light from a light source so that a pattern for forming a second different filter array is imprinted in the second different color photoresist layer, and the first color light, the second color light, the third color light together form a complete color level.

11. The method of claim 10, wherein the first different color photoresist layer includes a negative photoresist layer.

12. The method of claim 10, wherein the second different color photoresist layer includes a negative photoresist layer.

13. The method of claim 10, wherein the first color light, the second color light and the third color light are red light, green light and blue light, respectively.

14. A method of forming a blue filter array, comprising:
providing a substrate;
forming a passivation layer over the substrate;
forming a blue photoresist layer over the passivation layer; and
performing a photolithographic exposure of the blue photoresist layer using light of a wavelength smaller than or equal to about 248 nm so that a pattern for forming a blue filter array is imprinted on the blue photoresist layer.

15. The method of claim 14, wherein the blue photoresist layer includes a negative blue photoresist layer.

16. The method of claim 14, wherein the substrate further includes a light sensitive element array thereon.

17. The method of claim 16, wherein the light sensitive element array includes a plurality of metallic elements for generating a detectable electrical current when light impinges upon the elements.

18. The method of claim 14, wherein the passivation layer further includes a silicon oxynitride layer.

19. The method of claim 18, wherein the silicon oxynitride layer has a thickness greater than about 1000 Å.

20. The method of claim 14, wherein the light used in photolithographic exposure has a wavelength of about 248 nm.

\* \* \* \* \*